(12) United States Patent
Chua-Eoan

(10) Patent No.: US 7,961,502 B2
(45) Date of Patent: Jun. 14, 2011

(54) NON-VOLATILE STATE RETENTION LATCH

(75) Inventor: Lew Chua-Eoan, Carlsbad, CA (US)

(73) Assignee: QUALCOMM Incorporated, San Diego, CA (US)

( * ) Notice: Subject to any disclaimer, the term of this patent is extended or adjusted under 35 U.S.C. 154(b) by 154 days.

(21) Appl. No.: 12/328,042

(22) Filed: Dec. 4, 2008

(65) Prior Publication Data

US 2010/0141322 A1     Jun. 10, 2010

(51) Int. Cl.
*G11C 7/00* (2006.01)
(52) U.S. Cl. ......................................... 365/158; 365/173
(58) Field of Classification Search .................. 365/158, 365/173
See application file for complete search history.

(56) References Cited

U.S. PATENT DOCUMENTS

| | | | |
|---|---|---|---|
| 6,147,900 A | 11/2000 | Pohm | |
| 6,947,318 B1 | 9/2005 | Fujita | |
| 6,999,342 B2 | 2/2006 | Ooishi | |
| 7,372,723 B1 | 5/2008 | Lu et al. | |
| 7,733,145 B2 * | 6/2010 | Abe et al. | 327/218 |
| 2004/0057280 A1 * | 3/2004 | Ooishi | 365/170 |
| 2005/0157539 A1 | 7/2005 | Van Der Zaag et al. | |
| 2006/0039194 A1 * | 2/2006 | Hidaka | 365/171 |
| 2006/0083047 A1 * | 4/2006 | Fujita et al. | 365/145 |
| 2008/0229269 A1 | 9/2008 | Lamorey | |

OTHER PUBLICATIONS

International Search Report and Written Opinion—PCT/US2009/066490, International Search Authority—European Patent Office—Apr. 23, 2010.
Weisheng Zhao et al: "TAS-MRAM based Non-volatile FPGA logic circuit" Field-Programmable Technology, 2007. ICFPT 2007. International Conference on, IEEE, PI, Dec. 1, 2007, pp. 153-160, XP031208385 ISBN: 978-1-4244-1471-0 p. 3, paragraph 3-p. 7, paragraph 4; figures 3.1-4.6.

\* cited by examiner

*Primary Examiner* — Michael T Tran
(74) *Attorney, Agent, or Firm* — Sam Talpalatsky; Nicholas J. Pauley; Jonathan T. Velasco

(57) ABSTRACT

Electronic circuits use latches including a magnetic tunnel junction (MTJ) structure and logic circuitry arranged to produce a selective state in the MTJ structure. Because the selective state is maintained magnetically, the state of the latch or electronic circuit can be maintained even while power is removed from the electronic device.

16 Claims, 8 Drawing Sheets

NON-VOLATILE STATE RETENTION LATCH

TECHNICAL FIELD

The present disclosure relates, in general, to memory and, more particularly, to memory associated with non-volatile retention latches.

BACKGROUND

Modern electronic devices, especially those that operate on batteries, are typically designed with power savings in mind. Desktop computers generally switch into standby mode after a period of inactivity, display monitors go into sleep mode also after periods of inactivity, mobile phones collapse most non-essential functionality when not in use, and so on. However, while powering-down to enter this suspended state, many devices still expend a nontrivial amount of power maintaining nonvolatile memory. Much of this power expense is a result of current leakage across semiconductor devices that simply cannot complete shut down. While this power cost limits the overall power savings for devices connected to A/C power outlets, the power cost to battery-powered devices is battery time, which seriously affects the functional reliability of the device.

A challenge is that, when mobile devices are powered-down into a power-saving mode, users want the device to retain its state from when the power-savings mode was entered. This state information is typically maintained using latches and flip-flops within the core network of the device. The core network of a device is generally considered the circuitry that operates the core functionality of the device. The device will also usually have an input/output (I/O) network, which handles all external communication between the device and external components or devices. The core network will communicate with the I/O network in order to transmit or receive signals external to the device. Often times, the I/O network will operate at a different, higher voltage level than the core network. In such instances, the core network communicates with the I/O network through multiple level shifters.

Instead of keeping state information internally within the core network, the state information could alternatively be placed into external memory, i.e., a dynamic random access memory (DRAM), or non-volatile memory or the like. However, the device will generally use power to drive the I/O network when writing the state information to the DRAM, and the DRAM itself will still use power to maintain and refresh the memory content. Thus, external state maintenance does not typically offer any power-saving advantages over internal storage. Moreover, not all state information is stored within registers that are architecturally visible, i. e., can be accessed for reading and writing.

Two methods that have been implemented for core network state storage are (1) to scan the state into an on-chip (i.e., core network) memory; or (2) to use latches and flip-flops. Both methods provide for the device to be shut-down or power collapsed in general. However, both methods also maintain power to either the on-chip memory or latch to preserve the state stored in those components. In order to maintain power to these components, a second power source or power rail is generally provided. Shutting down or collapsing the power may be performed by disconnecting the power supply using a switch, such as a complementary metal-oxide-semiconductor (CMOS) transistor switch, or by collapsing the main supply voltage (referred to herein as $V_{DD}$) to ground. Because of the limits in CMOS and other transistor technologies, current leakage typically occurs because a potential will still exist across the CMOS switch even though $V_{DD}$ has been disconnected or is now at ground. Therefore, even when the device is powered-down power is being drained from the battery.

Turning now to FIG. 1A, a circuit diagram of a typical flip-flop 10 is illustrated. Flip-flop 10 is a typical master-slave configuration having a functional test mode multiplexer 100 at the front end. Depending on the input to the functional test mode multiplexer 100, either the scanned in (Si) or functional (D) path will be selected. The scan-elect signal, $S_E$, and its inverse, $S_EN$, are provided as input to the multiplexer 100 as received from the scan-elect circuit 106. The multiplexer 100 is coupled to a master latch 101 which is coupled to a slave latch 102. The master and slave latches 101-102 typically operate on opposite phases of the clock. The control circuitry 104 uses the clock signal, Clk, to generate the two internal clock phase signals, Ck and CkN, for driving the flip-flop 10. An output 103 provides the output signal, Q, and its negative, Q-BAR.

The control circuitry 104 and retainer circuitry 105, which is made up of the slave latch 102 and a three-state device 107, are the retain-state components and are, thus, always-on, even when the rest of the circuit 10 is collapsed or powered-down. As such, the control circuitry 104 and retainer circuitry 105 are powered by $V_{DD\text{-}Retain}$ (FIG. 1B), while the remainder of the components of the circuit 10 are powered by $V_{DD}$ (FIG. 1B).

In operation, the master latch 101 is set with a state through operation of the multiplexer 100. The slave latch 102 is then set with the state from the master latch 101. When power is shut down, all of the components except the control circuitry 104 and the retainer circuitry 105 lose their respective power connections to $V_{DD}$. $V_{DD\_Retain}$, however, maintains power to the control circuitry 104 and retainer circuitry 105. Therefore, the slave latch 102 retains the state of the master latch 101 even though the master latch 101 is now not connected to power. When the device, in which the flip-flop 10 is located, powers back on, the state information from the slave latch 102 does not directly get set back in master latch 101. In a typical configuration, flip-flops, such as the flip-flop represented by the flip-flop 10, are coupled in series. When the power comes back up in the device, the Retain-BAR signal triggers a transparency of the master latch 101. Therefore, the state information in the slave latch 102 is propagated down the series to the next flip-flop, which sets the state in the master latch of that flip-flop. In final "wake-up" operation, the master latch 101 eventually is reset to the appropriate state through the wake-up state propagation.

FIG. 1B is a pin diagram illustrating a flip-flop package 11 containing the flip-flop 10 (FIG. 1A). Because parts of the flip-flop 10 are always on, the flip-flop package 11 uses two power supplies, $V_{DD}$ 107 and $V_{DD\_Retain}$ 108. There is also a connection terminal for $V_{SS}$ 115, which may be connected to ground. The retain-BAR signal 109 is the input to the flip-flop package 11 that affects the control circuitry 104 (FIG. 1A) when power-restore occurs and the state is being restored. A data (D) input 110 is the functional input to the flip-flop 10. The clock (Clk) input 111 is the external clock input provided to the flip-flop package 11 used in the control circuitry 104 for driving the flip-flop 10. A scan-elect (SE) control input 112 is used in a scan-elect circuit 106 to provide selections with the multiplexer 100 (FIG. 1A). Finally, output terminals, Q 113 and Q-BAR 114, provide the desired flip-flop output based on the functional input to the flip-flop package 11.

This arrangement reveals another shortcoming with the current methods, namely increasing the complexity of the semiconductor chip fabrication. A second, separate power rail or power supply, such as $V_{DD\_Retain}$ 108 (FIG. 1B), uses extra manufacturing steps for metallization layers connecting the second power source with the appropriate circuit elements in addition to the control signaling network for controlling the second power source. All of this additional processing costs the manufacturer money.

FIG. 2A is a circuit diagram illustrating another typical flip-flop 20. The flip-flop 20 illustrates another typical master-slave flip-flop configuration. A functional test mode multiplexer 200 selects either the scanned-in or data paths to feed a master latch 201. The master latch 201 then feeds its state into the slave latch 202. The flip-flop 20 includes another latch, a retain latch 203, that obtains the current state information from the slave latch 202. Thus, the retain latch 203 is impressed with the state information from the slave latch 202. An output circuit 204 provides the resulting flip-flop alternative outputs of Q and Q-BAR. A clock circuit 205 accepts the external clock signal (Clk) as input and produces both the internal clock signals, CkN and Ck. A scan-elect circuit 206 provides both $S_E$ and $S_EN$ for operation of the flip-flop 20.

The configuration of the flip-flop 20 places the state-retention circuit, the retain latch 203, outside of the critical path of the flip-flop 20. The critical path is the main path from the multiplexer 200 through the master and slave latches 201 and 202 and then to the output 204. Control of the retain latch 203 is effected by the save circuitry 207 and the restore node 209. The save circuit 207 provides both Save and Save-BAR signals to the operation of the flip-flop 20. Save and Save-BAR operate to write the current state into the retain latch 203 from the slave latch 202. When the flip-flop 20 is powered down, all power is taken off from everything except the save circuitry 207 and the retain circuitry 208, which comprises the slave latch 203 and the circuit 210. The save circuitry 207 and the retain circuitry 208 are always-on receiving power from $V_{DD\_Restore}$ (FIG. 2B). When the flip-flop 20 is powered-up, input of Restore and NRestore signals trigger the three-state device 209 to impress the saved previous state back onto the master latch 201.

In designing the components for the existing flip-flops, such as those illustrated in FIGS. 1A, 1B, 2A, and 2B, the devices themselves may also be more expensive when the application suggests using higher threshold-voltage devices. The always-on components, i.e., the control circuitry 104 and the retainer circuitry 106 in FIG. 1A and the save circuit 207 and the retain circuitry 208 in FIG. 2A, are often selected to be more robust and capable of handling higher voltages without leaking. In general, CMOS technology can be manufactured in essentially three "grades": high threshold voltage (HVT), normal threshold voltage (NVT), and low threshold voltage (LVT). The higher the threshold voltage, the less current leakage will typically result when the transistor is "off." HVT CMOS is usually more expensive than NVT or LVT. Thus, if a manufacturer attempts to reduce the power leakage by building the critical "always-on" components in these devices from HVT CMOS, there is added expense there as well.

FIG. 2B is a pin diagram illustrating a flip-flop package 21 containing the flip-flop 20 (FIG. 2A). Because parts of the flip-flop 20 are always on, the flip-flop package 21 uses two power supplies, $V_{DD}$ 107 and $V_{DD\_Retain}$ 108, as with the flip-flop package 11 (FIG. 1B). The flip-flop package 21 also includes the $V_{SS}$ 115 terminal. An NRestore signal 211 is the input signal used on power-up, when directing the save circuitry 208 (FIG. 2A) to impress the saved state information back onto the master latch 201 (FIG. 2A). A data (D) input 110 is the functional input to the flip-flop 20. A clock (Clk) input 111 is the external clock input provided to the flip-flop package 21 used in the control circuitry 104 for driving the flip-flop 20. The scan-elect (SE) control input 112 is used in the scan-elect circuit 106 to provide selections with the multiplexer 200 (FIG. 2A). Output terminals, Q 113 and Q-BAR 114, provide the desired flip-flop output based on the functional input to the flip-flop package 11. Unlike the flip-flop 10 (FIG. 1A), the flip-flop 20 uses Save and SaveN signals to control the saving of the state information into the retain latch 203. Thus, the Save input 212 provides this input into the flip-flop package 21.

SUMMARY

Various representative embodiments of the present invention relate to electronic circuits that use latches which include a magnetic tunnel junction (MTJ) structure and logic circuitry arranged to produce a selective state in the MTJ structure. Because the selective state is maintained magnetically, the state of the latch or electronic circuit can be maintained even while power is removed from the electronic device.

Representative embodiments relate to latches for use in an electronic circuit. The latches include an MTJ structure and logic circuitry arranged to produce a selective state in the MTJ structure.

Additional representative embodiments relate to methods for maintaining a state in an electronic circuit. Such methods include receiving an input signal and a save signal, establishing a first polarity in a free magnetic layer of an MTJ structure, responsive to a combinational relationship between the input signal and the save signal. The state of the electronic circuit is determined by a polarity relationship between the first and second magnetic layers.

Further representative embodiments relate to electronic circuits that include at least one non-magnetic latch, a magnetic latch coupled to the non-magnetic latch and configured to hold a state representative of a current state of the non-magnetic latch, and means, operative when the electronic circuit is powered up, to restore the current state to the non-magnetic latch using the state.

Still further representative embodiments relate to electronic circuits that include a master non-magnetic latch configured to hold a current state, zero or more slave non-magnetic latches coupled to the master non-magnetic latch and configured to hold the current state, and a magnetic latch coupled to the master non-magnetic latch and the slave non-magnetic latches. The magnetic latch is configured to retain a selected state corresponding to the current state. The magnetic latch retains the selected state while power is removed from the electronic circuit and restores the current state to the master non-magnetic latch using the selected state when the power is restored to the electronic circuit.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 3:
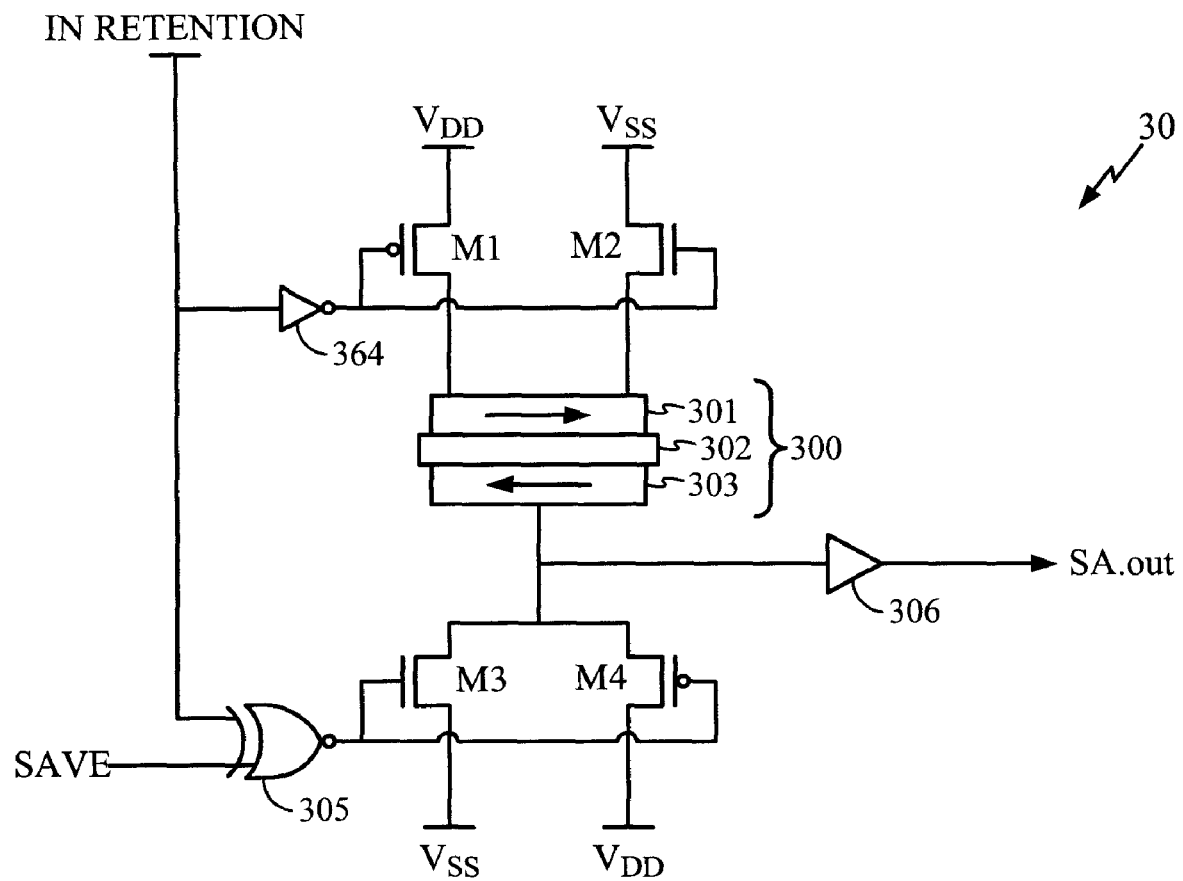
FIG. 3 is a circuit diagram illustrating a magnetic latch configured in accordance with the teachings of the present disclosure.

FIG. 3 is a circuit diagram illustrating a magnetic latch 30 configured according to one embodiment of the present invention. The magnetic latch 30 includes a magnetic tunnel junction (MTJ) 300, which includes a magnetic layer 301, an insulator layer 302, and a magnetic layer 303. The magnetic layers 301 and 303 may be constructed from a variety of transitional-metal ferromagnets and other magnetic materials, including cobalt-iron, or the like, while the insulator layer 302 may be constructed from a variety of insulating materials, such as aluminum oxide or the like. Depending on the current or voltage level applied to the MTJ 300, the relative polarities of the magnetic layers 301 and 303 are affected. In one instance, applying a particular current or voltage level will cause the polarity in the magnetic layer 301 to be anti-parallel to the magnetic layer 303. Similarly, another current or voltage level will cause the polarities of the magnetic layers 301 and 303 to be the same or parallel.

The magnetic latch 30 is configured such that the transistors M1 and M2 are coupled in parallel to each other, where M1 is coupled at one terminal to $V_{DD}$ and M2 is coupled at one terminal to $V_{SS}$. Another terminal of M1 and M2 is coupled to the MTJ 300. The gates of both of transistors M1 and M2 are coupled to a circuit 304 providing the IN Retention signal. M1 is configured as a p-type metal oxide semiconductor (PMOS) transistor, while M2 is configured as an n-type MOS (NMOS). Thus, depending on the signal received from the circuit 304 either M1 will be switched on, pulling up the voltage on the MTJ 300 to $V_{DD}$, while M2 is off, or M2 will be switched on, pulling the voltage on the MTJ 300 to $V_{SS}$. Because of the different transistor types, M1 and M2 will generally not be on at the same time.

The transistors M3 and M4 are also coupled in parallel to each other, wherein each has a terminal connected to the MTJ 300, and wherein each has another terminal connected to $V_{SS}$ and $V_{DD}$. Each of the gate terminals of M3 and M4 is connected to an XNOR gate 305. As shown, the transistor M3 is configured as an NMOS, while the transistor M4 is configured as a PMOS. Thus, as with M1 and M2, either M3 is off while M4 is on or M3 is on while M4 is off as determined by the combinational relationship between the IN Retention and SAVE signals provided by the XNOR gate 305.

Depending on whether the MTJ 300 is connected from $V_{DD}$ to $V_{SS}$ or from $V_{SS}$ to $V_{DD}$, (i.e., whether M1 and M3 are on, or M2 and M4 are on) the polarity in the magnetic layers 301 and 303 will either be parallel or anti-parallel (storing either a 0 state or 1 state). By measuring the resistance of the MTJ 300, the specific state saved within the MTJ 300 can be determined. This state information is provided to a buffer circuit 306 (or a sense amplifier) and held as the output from the latch 30, SA.out. Therefore, by utilizing the deterministic Save signal, in combination with the IN Retention signal, the state can be magnetically set within the MTJ 300 and provided in an output, SA.out (sense amplifier output). Because the MTJ 300 sets and holds the state information magnetically, no power is necessary to maintain the state in the magnetic latch 30.

In one embodiment, when the SAVE signal is enabled a DC connection is provided to the MTJ 300 enabling a write operation. In one example, in order to write a 1 into the MTJ 300, a 1 is impressed on the IN Retention lead, and the SAVE signal is enabled. Thus, the transistors M1 and M3 are on, so that current from $V_{DD}$ to $V_{SS}$ runs through the MTJ 300. Similarly, to write a 0 into the MTJ 300, a 0 is provided on the IN Retention lead, and a 1 is provided on the SAVE lead. Thus, the transistors M2 and M4 are on, so that current from $V_{SS}$ to $V_{DD}$ runs through the MTJ 300. The state (parallel or anti-parallel) of the MTJ 300 can be resistively sensed, as noted above, to read the state from the MTJ 300.

Figure 1A:
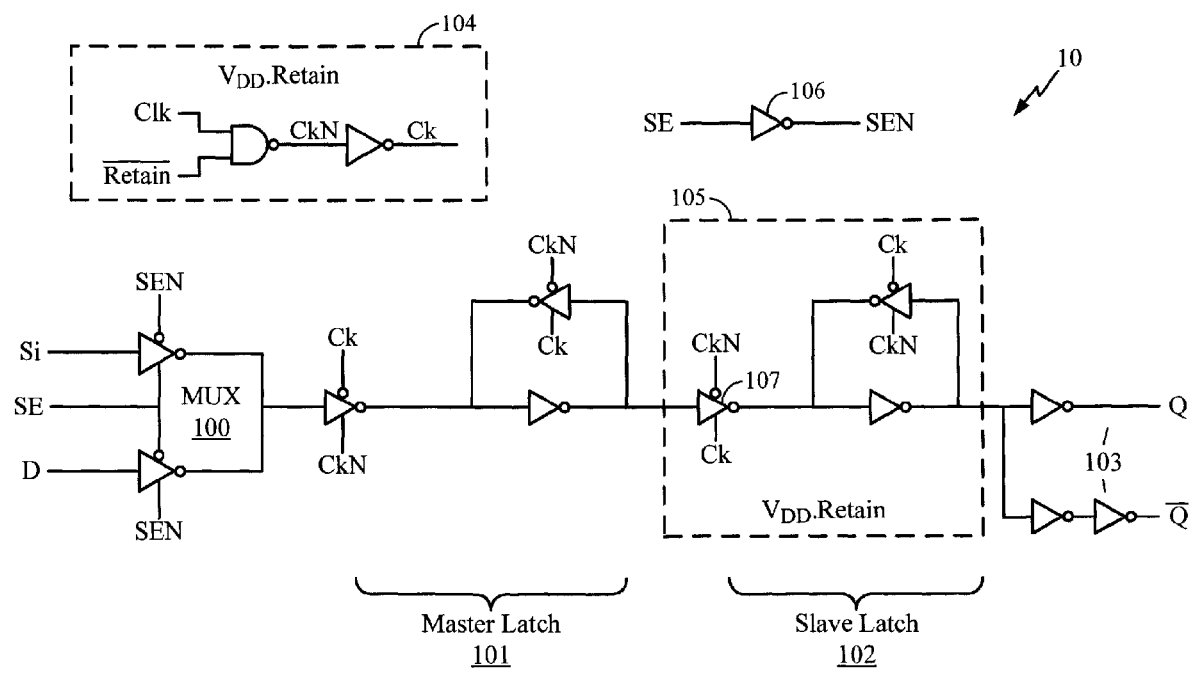
FIG. 1A is a circuit diagram illustrating a conventional flip-flop.
Figure 1B:
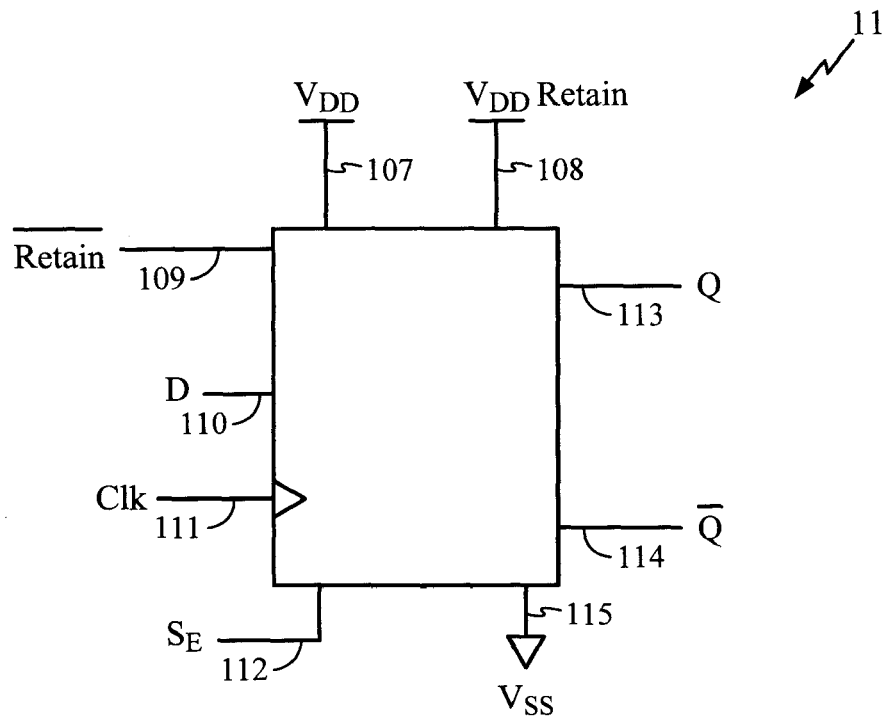
FIG. 1B is a pin diagram illustrating a conventional flip-flop package containing a conventional flip-flop according to FIG. 1A.
Figure 4A:
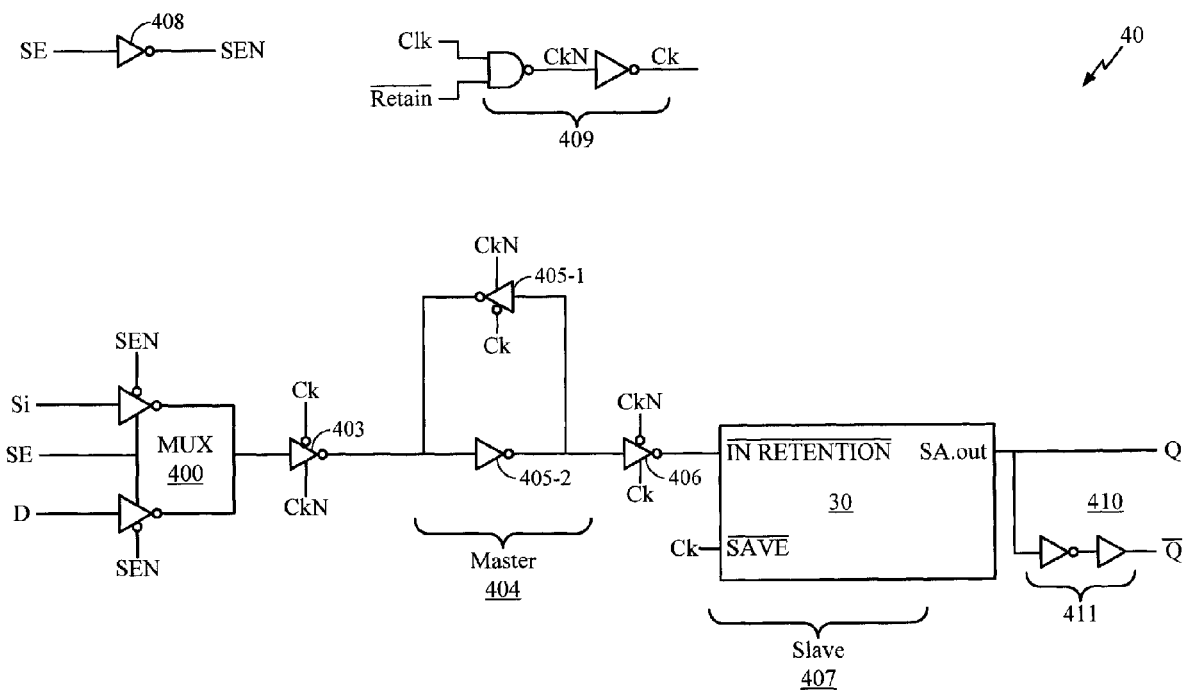
FIG. 4A is a circuit diagram illustrating a flip-flop that includes a magnetic latch configured in accordance with the teachings of the present disclosure.

Turning now to FIG. 4A, a circuit diagram of a flip-flop 40 is illustrated that includes a magnetic latch 30 configured according to one embodiment. The flip-flop 40 is configured as an improved version of the master-slave flip-flop 10 of FIG. 1, with the magnetic latch 30 replacing the slave latch 102. Similar to FIG. 1, a functional test mode multiplexer 400 comprises three-way devices 401 and 402 operable to select either the scanned-in or data path to feed a master latch 404 via a three-way device 403. The master latch 404 stores the received value.

The scan-enable signals, $S_E$ and $S_EN$, are provided to the multiplexer 400 through a scan-enable circuit 408. An always on internal clock signal Ck, as well as the inverse signal CkN, control the three-way devices 403, 405-1, 406. The signals Ck and CkN, are provided via a clock circuit 409.

The master latch 404, which comprises three-way devices 405-1 and 405-2 outputs state information to a three-way device 406, which then outputs to a slave latch 407, which in this embodiment is the magnetic latch 30. The SA.out signal of the magnetic latch 30, provides the output of the flip-flop 40 to an output stage 410 with Q and Q-BAR, inverted through the inverter circuit 411. [***LEW: THE FIGURE SHOWS 410 AS INCLUDING TWO INVERTORS.

SHOULD A SINGLE INVERTER BE SHOWN IN ADDITION TO A BUFFER?***] The deterministic save signal, SAVE, is provided by the internal clock signal, Ck. The IN Retention signal is received as the output of the master latch 404. By using the magnetic latch 30 as the slave latch 407, the flip-flop 40 is able to retain state without maintaining an always-on power source. When the flip-flop 40 powers down the state information is maintained magnetically in the MTJ 300 (FIG. 3).

Figure 2B:
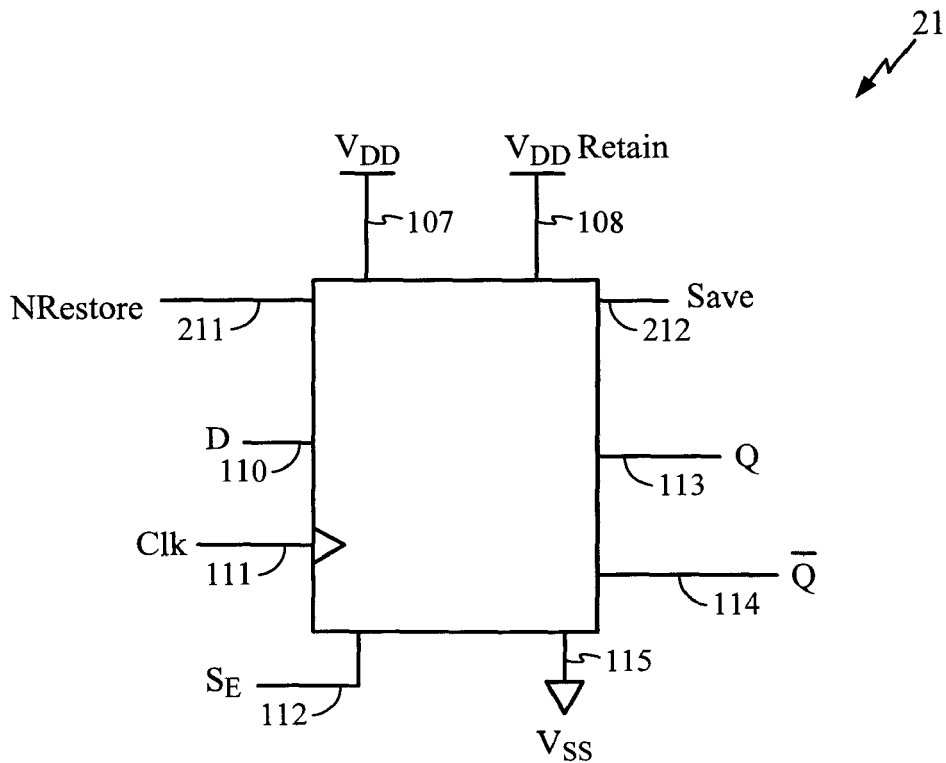
FIG. 2B is a pin diagram illustrating another conventional flip-flop package containing a conventional flip-flop according to FIG. 2A.
Figure 4B:
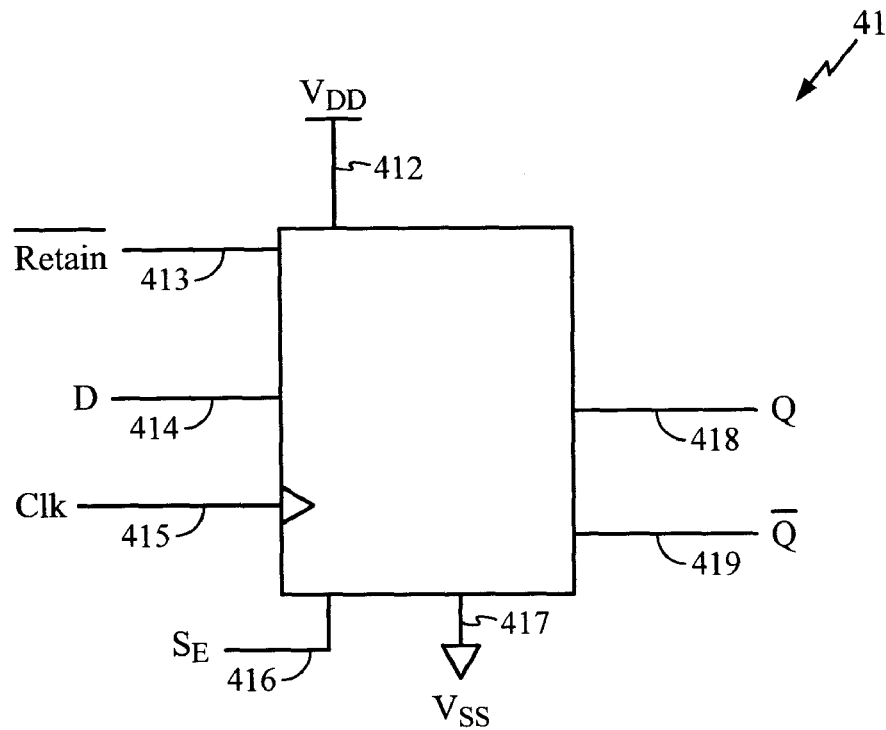
FIG. 4B is a pin diagram illustrating a flip-flop package containing a flip-flop configured in accordance with the teachings of the present disclosure.

FIG. 4B is a pin diagram of a flip-flop package 41 configured according to one embodiment. The flip-flop 40 (FIG. 4A) is contained within the flip-flop package 41. Pin connectors to the flip-flop package 41 include a $V_{DD}$ 412, a Retain-BAR 413, a data (D) 414, a clock (Clk) 415, a scan-enable (SE) 416, a $V_{SS}$ 417, and outputs, Q 418 and Q-BAR 419. In comparison to the flip-flop packages 11 (FIG. 1B) and 21 (FIG. 2B), the flip-flop package 41 does not include the second power supply rail that the flip-flops 10 and 20 used to maintain state. Thus, there is less circuitry involved, i.e., less complexity, because there is no longer a need for extra wiring for the second power supply. Moreover, when the flip-flop 40 powers down, no extra power is used to maintain state. When the flip-flop 40 powers back up, the state is read from the MTJ 300 (FIG. 3) via the buffer circuit 306 (FIG. 3) and the circuit proceeds as before power down.

Figure 2A:
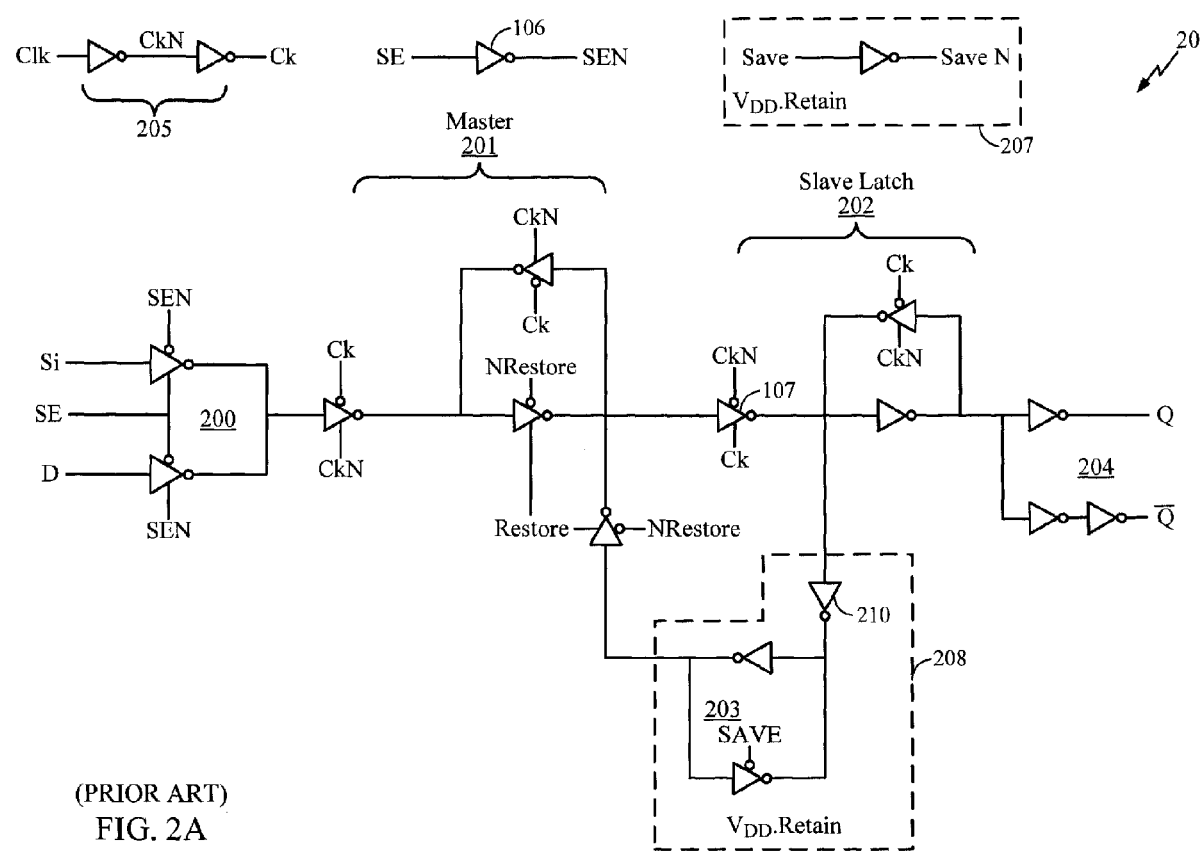
FIG. 2A is a circuit diagram illustrating another conventional flip-flop.
Figure 5B:
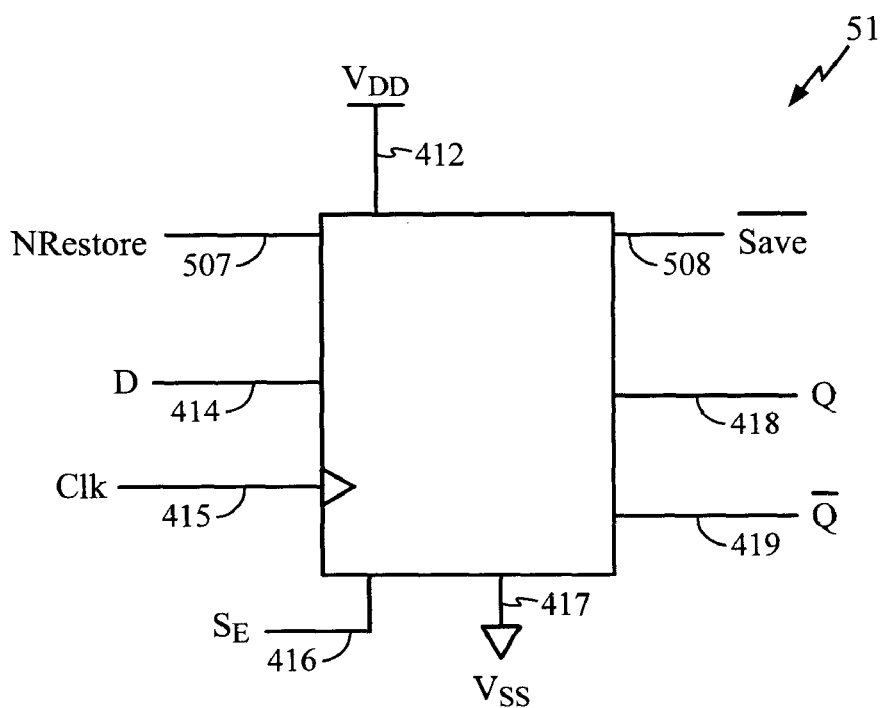
FIG. 5B is a pin diagram illustrating a flip-flop package including a flip-flop configured in accordance with the teachings of the present disclosure.
Figure 5A:
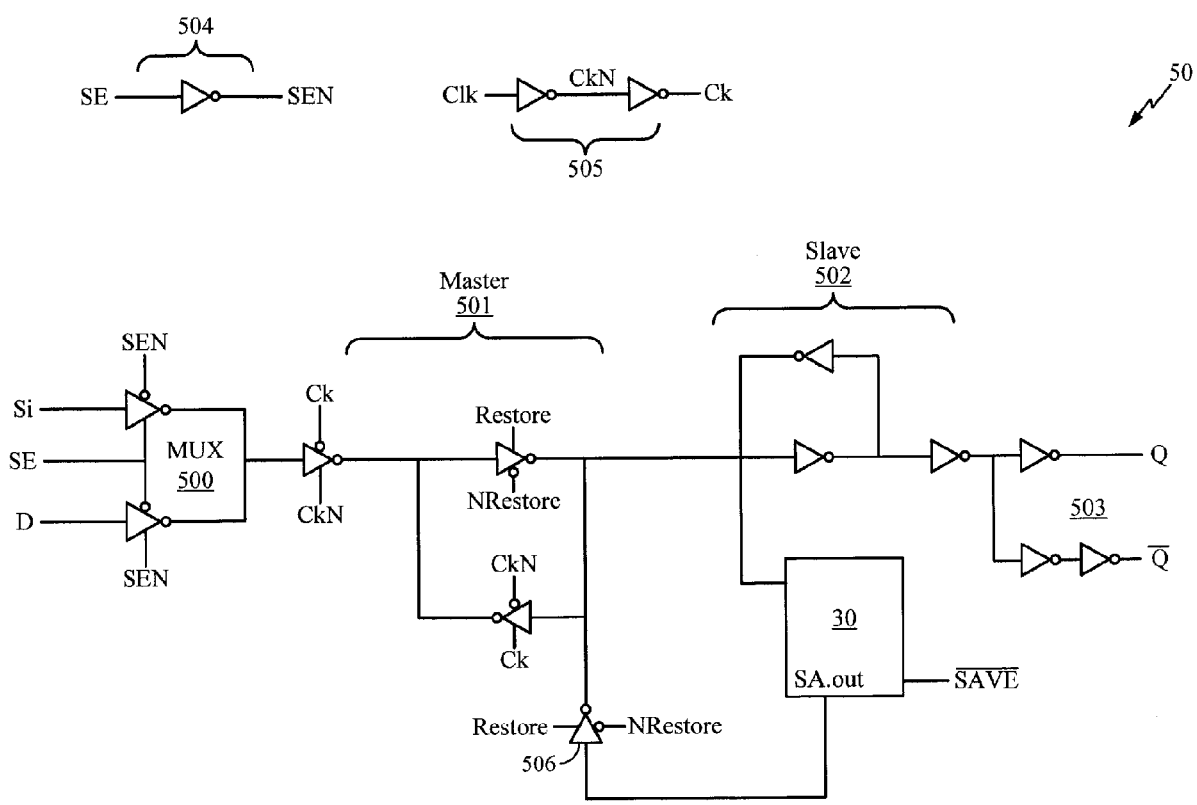
FIG. 5A is a circuit diagram illustrating a flip-flop that includes a magnetic latch configured in accordance with the teachings of the present disclosure.

Turning now to FIG. 5A, a circuit diagram of a flip-flop 50 is illustrated that includes the magnetic latch 30 configured according to one embodiment. The flip-flop 50 is configured as a master-slave flip-flop, similar to FIG. 2A, however, the flip-flop 50 includes a magnetic latch 30 outside of a critical path. The multiplexer 500 uses scan-enable signals, $S_E$ and $S_E N$, provided by a scan-enable circuit 504, to select the appropriate pathway. A master latch 501 receives the signal from the multiplexer 500 and passes its state information to a slave latch 502. The slave latch 502 provides output to an output terminal 503, outputting Q and Q-BAR from the flip-flop 50.

A clock circuit 505 provides the internal clock signal Ck and the inverted clock signal CkN for the flip-flop 50 operation. The scan-enable signals, $S_E$ and $S_E N$, are provided to the multiplexer 500 through a scan-enable circuit 504.

The magnetic latch 30 also receives the state information from the master latch 501. The received state information is used as the In Retention signal of the magnetic latch 30. Moreover, the magnetic latch 30 receives a specific always on deterministic save input signal, SAVE, in order to provide an asynchronous SAVE signal to the magnetic latch 30.

When powering down, all power is removed from the flip-flop 50, with the magnetic latch 30 retaining the state information magnetically, as described above. As the flip-flop 50 is again powered up, the Restore and NRestore signals are used to trigger the magnetic latch 30 to feed the saved state information back into the master latch 501 through a three-way device 506. The Restore and NRestore basically switch the three-way device 506 on allowing the state information in the magnetic latch 30 to be transmitted to the master latch 501. Again, as with the flip-flop 40 (FIG. 4), no additional power source is needed to preserve the state. Thus, the complexity and power use of the flip-flop 50 is much lower than in existing flip-flops.

FIG. 5B is a pin diagram of a flip-flop package 51 configured according to one embodiment of the present invention. The flip-flop 50 (FIG. 5A) is contained within the flip-flop package 51. Pin connectors to the flip-flop package 51 include the same pin connectors as the flip-flop package 41, such as the $V_{DD}$ 412, the data (D) 414, the clock (Clk) 415, the scan-enable (SE) 416, the $V_{SS}$ 417, and the outputs, Q 418 and Q-BAR 419. However, because the flip-flop 50 uses the Restore and NRestore signals and provides an asynchronous deterministic save signal, the flip-flop package 51 also includes the pin connectors NRestore 507 and SAVE 508.

Figure 6:
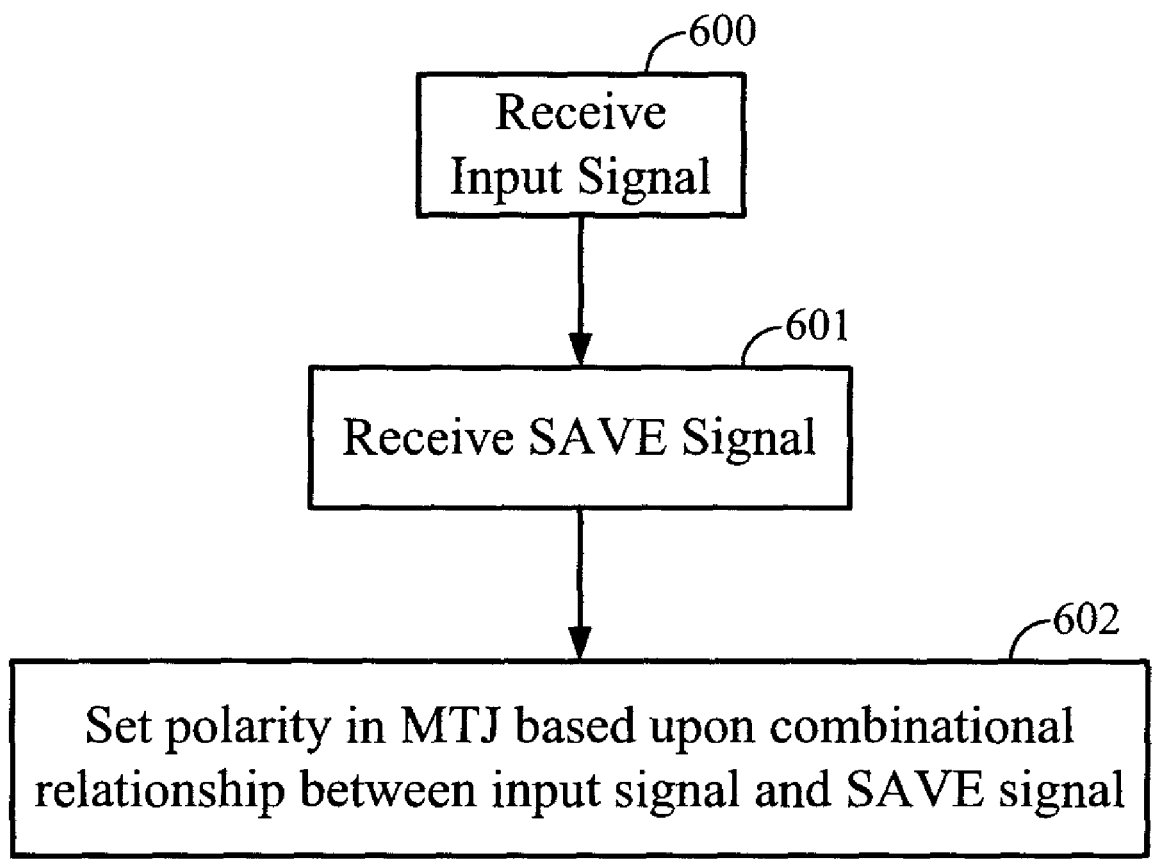
FIG. 6 is a flowchart illustrating example blocks executed to implement various embodiments in accordance with the teachings of this disclosure.

FIG. 6 is a flowchart illustrating example blocks for implementing an embodiment. In block 600, an input signal is received. A save signal is received in block 601. In block 602, a polarity is established in a free magnetic layer of a magnetic tunnel junction (MTJ) structure, responsive to a current created based upon a combinational relationship between the input signal and the save signal. The state of an electronic circuit is determined by a polarity relationship between the free magnetic layer and a fixed magnetic layer.

Although specific circuitry has been set forth, it will be appreciated by those skilled in the art that not all of the disclosed circuitry is required to practice the invention. Moreover, certain well known circuits have not been described, to maintain focus on the invention. Similarly, although the description refers to logical "0" and logical "1" in certain locations, one skilled in the art appreciates that the logical values can be switched, with the remainder of the circuit adjusted accordingly, without affecting operation of the present invention.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A latch for use in an electronic circuit, said latch comprising:
   a magnetic tunnel junction (MTJ) structure; and
   logic circuitry configured to produce a selected mutually exclusive state in said MTJ structure before collapsing power in the electronic circuit; the logic circuitry being qualified by an always on save signal in combination with an input retention signal, the logic circuitry comprising
   a first transistor pair coupled to said MTJ structure;
   a second transistor pair coupled to said MTJ structure; and
   selection circuitry coupled to each gate terminal of said first and second transistor pairs, wherein said selection circuitry is configured to select a voltage level to apply to said MTJ structure through one of said first transistor pair and one of the second transistor pair responsive to said input retention signal and said save signal.

2. The latch of claim 1 further comprising an output buffer for reading said selected state in said MTJ structure.

3. The latch of claim 2, in which the output buffer comprises a sense amplifier.

4. The latch of claim 1 wherein said save signal is deterministic of said selected state.

5. The latch of claim 1 wherein said selection circuitry comprises:
an input circuit to said first transistor pair, wherein, responsive to said input retention signal, said input circuit causes one of said first transistor pair to switch on while the other of said first transistor pair switches off; and
a combination circuit coupled to said second pair of transistors and configured to receive said input retention signal and said save signal as input, wherein, based on an output of said combination circuit, said combination circuit causes one of said second transistor pair to switch on, while it causes the other of said second transistor pair to switch off 6. The latch of claim 1 wherein said MTJ structure comprises:
a fixed magnetic layer;
an insulating layer coupled on a first side to said fixed magnetic layer; and
a free magnetic layer having a voltage-selectable polarity and coupled to a second side of said insulating layer, such that said insulating layer is between said fixed and free magnetic layers.

7. An electronic circuit comprising:
at least one non-magnetic latch;
a magnetic latch coupled to said at least one non-magnetic latch and configured to hold a state representative of a current state of said at least one non-magnetic latch; and
means, operative when said electronic circuit is powered up, to restore said current state to said at least one non-magnetic latch using said state, the means to restore comprising a switch coupled to said magnetic latch and said at least one non-magnetic latch, said switch configured to communicate said state from said magnetic latch to said at least one non-magnetic latch responsive to receiving a restore signal.

8. The electronic circuit of claim 7 wherein said magnetic latch comprises:
a magnetic tunnel junction (MTJ) structure comprising:
a free magnetic layer having a voltage-selectable polarity;
a fixed magnetic layer; and
an insulation layer in between said free and fixed magnetic layers;
a selection circuit coupled to said MTJ structure, wherein said selection circuit is configured to select a voltage level to apply to said MTJ structure responsive to a combinational relationship between an input retention signal and a save signal.

9. The electronic circuit of claim 8 wherein said magnetic latch further comprises:
an output circuit for measuring a resistance of said MTJ structure, wherein said resistance determines said state of said magnetic latch.

10. An electronic circuit comprising:
at least one non-magnetic latch;
a magnetic latch coupled to said at least one non-magnetic latch and configured to hold a state representative of a current state of said at least one non-magnetic latch;
means, operative when said electronic circuit is powered up, to restore said current state to said at least one non-magnetic latch using said state,
an input terminal to said magnetic latch coupled to a slave latch of said at least one non-magnetic latch; and
an output terminal from said magnetic latch coupled to said switch, wherein said at least one non-magnetic latch coupled to said switch is a master latch.

11. An electronic circuit comprising:
a master non-magnetic latch configured to hold a current state; and
a magnetic latch coupled to said master non-magnetic latch and zero or more slave non-magnetic latches, said magnetic latch configured to retain a selected state corresponding to said current state, wherein said magnetic latch retains said selected state while power is removed from said electronic circuit and restores said current state to said master non-magnetic latch using said selected state when said power is restored to said electronic circuit.

12. The electronic circuit of claim 11 wherein said magnetic latch comprises:
a magnetic tunnel junction (MTJ) structure comprising:
a free magnetic layer having a voltage-selectable polarity;
a fixed magnetic layer; and
an insulation layer in between said fixed and free magnetic layers;
a selection circuit coupled to said MTJ structure, said selection circuit configured to select a voltage level to apply to said MTJ structure responsive to a combinational relationship between an input retention signal and a save signal.

13. The electronic circuit of claim 12 wherein said save signal is applied asynchronously.

14. The electronic circuit of claim 11 further comprising:
a restore switch coupled to said magnetic latch and said master non-magnetic latch, wherein said restore switch is configured to communicate said selected state from said magnetic latch to said master non-magnetic latch responsive to receiving a restore signal.

15. The electronic circuit of claim 11 further comprising:
an input multiplexer configured to select between a data path and a scan-enabled path of said electronic circuit; and an output circuit coupled to one of: said zero or more slave non-magnetic latches or said magnetic latch, wherein said output circuit produces an output corresponding to one or more of: said current state and a complement of said current state.

16. The electronic circuit of claim 11 further comprising:
zero or more slave non-magnetic latches coupled to said master non-magnetic latch and configured to hold said current state.

* * * * *